United States Patent
Guha et al.

[11] Patent Number: 5,977,476
[45] Date of Patent: Nov. 2, 1999

[54] HIGH EFFICIENCY PHOTOVOLTAIC DEVICE

[75] Inventors: Subhendu Guha; Chi C. Yang, both of Troy, Mich.; Xi Xiang Xu, Findlay, Ohio

[73] Assignee: United Solar Systems Corporation, Troy, Mich.

[21] Appl. No.: 08/731,497

[22] Filed: Oct. 16, 1996

[51] Int. Cl.$^6$ .................................................. H01L 25/00
[52] U.S. Cl. .......................... 136/249; 136/255; 136/258
[58] Field of Search ............... 136/249 TJ, 258, 136/255

[56] References Cited

U.S. PATENT DOCUMENTS

| | | | |
|---|---|---|---|
| 4,600,801 | 7/1986 | Guha et al. | 136/249 |
| 4,609,771 | 9/1986 | Guha et al. | 136/249 |
| 4,773,942 | 9/1988 | Hamakawa et al. | 136/258 AM |
| 5,298,086 | 3/1994 | Guha et al. | 136/249 |
| 5,730,808 | 3/1998 | Yang et al. | 136/249 |

*Primary Examiner*—Mark Chapman
*Attorney, Agent, or Firm*—Gifford, Krass, Groh, Sprinkle, Anderson & Citkowski, P.C.

[57] ABSTRACT

An N-I-P type photovoltaic device includes a multi-layered body of N-doped semiconductor material which has an amorphous, N doped layer in contact with the amorphous body of intrinsic semiconductor material, and a microcrystalline, N doped layer overlying the amorphous, N doped material. A tandem device comprising stacked N-I-P cells may further include a second amorphous, N doped layer interposed between the microcrystalline, N doped layer and a microcrystalline P doped layer. Photovoltaic devices thus configured manifest improved performance, particularly when configured as tandem devices.

13 Claims, 2 Drawing Sheets

HIGH EFFICIENCY PHOTOVOLTAIC DEVICE

RIGHTS UNDER GOVERNMENT CONTRACT

The government of the United States of America has rights in this invention under subcontract ZAN-4-13318-02 awarded by the Department of Energy.

FIELD OF THE INVENTION

This invention relates generally to photovoltaic devices. More specifically the invention relates to P-I-N type photovoltaic devices in which the body of N type semiconductor material is a multi-layered structure having optimized optical and electrical properties. In a most specific embodiment, the present invention relates to a photovoltaic device comprised of a plurality of stacked, tandem photovoltaic cells which incorporate the multi-layered body of N type material of the present invention.

BACKGROUND OF THE INVENTION

Photovoltaic devices provide a nonpolluting, silent and reliable source of electrical power. A number of techniques have now been developed for the fabrication of thin film photovoltaic devices which can be manufactured at a relatively low cost and over large areas.

Thin film photovoltaic devices, particularly those manufactured from semiconductor alloys including group IV elements, are frequently fabricated in a N-I-P configuration. In devices of this type, a body of substantially intrinsic semiconductor material is interposed between oppositely doped layers of semiconductor material. Absorption of a photon by the semiconductor material in the intrinsic layer causes the generation of an electron/hole pair, and these carriers are swept out of the intrinsic layer by a built-in field established by the presence of the P doped and N doped layer, so as to be collected by electrodes associated with the device. It is to be understood that within the context of this disclosure, the intrinsic layer of the N-I-P type device may be very slightly P type or N type; however, within the device such layers will still function as intrinsic layers and hence are referred to as substantially intrinsic. It is also to be understood that such cells are often fabricated in an inverted configuration, and remarks made regarding N-I-P cells are also applicable to P-I-N cells as well.

Since, in an N-I-P type photovoltaic device photo generation of carriers takes place within the intrinsic body, it is desirable that passage of light thereinto be as unimpeded as possible. Also, it is desirable that the electrical conductivity of the various layers of the device be as high as is practically possible, so as to minimize resistive losses. Accordingly, it is preferred that, at least the light incident layer of an N-I-P type photovoltaic device be fabricated from a high transparency, high conductivity semiconductor material. U.S. Pat. No. 4,600,801 discloses a highly conductive, highly transparent P doped, microcrystalline semiconductor alloy material having particular utility in N-I-P type photovoltaic devices, and the disclosure thereof is incorporated herein by reference. As specifically disclosed therein microcrystalline materials are a type of disordered material which are distinguishable from amorphous materials insofar as they exhibit a threshold volume fraction of crystalline inclusions at which substantial changes in key parameters, including electrical conductivity, band gap and absorption constant occur.

The concept of microcrystalline materials exhibiting a threshold volume fraction of crystalline inclusions at which substantial changes in key parameters occur can best be understood with reference to the percolation model of disordered materials. Percolation theory, as applied to microcrystalline disordered materials, analogizes properties such as the electrical conductivity manifested by microcrystalline materials, to the percolation of a fluid through a nonhomogeneous, semipermeable medium such as a gravel bed. Microcrystalline materials are formed of a random network which includes low conductivity, highly disordered regions of materials surrounding randomized, highly ordered crystalline inclusions having high electrical conductivity. Once these crystalline inclusions attain a critical volume fraction of the network (which critical volume will depend, inter alia, upon the size and/or shape and/or orientation of the inclusions), it becomes a statistical probability that said inclusions are sufficiently interconnected so as to provide a low resistance current path through the network. Therefore, at this critical or threshold volume fraction, the material exhibits a sudden increase in conductivity. This analysis (as described in general terms relative to electrical conductivity herein) is well known to those skilled in solid state theory and may be similarly applied to describe additional physical properties of microcrystalline materials such as optical gap, absorption constant, etc.

The onset of this critical threshold value for the substantial change in physical properties of microcrystalline materials will depend upon the size, shape and orientation of the particular crystalline inclusions, but is relatively constant for different types of materials. The shape of the crystalline inclusions is critical to the volume fraction necessary to reach the threshold value. There exist one-dimensional, two-dimensional and three-dimensional models which predict the volume fraction of inclusions necessary to reach the threshold value, these models being dependent on the shape of the crystalline inclusions. For instance, in a one-dimensional model (which may be analogized to the flow of charge carriers through a thin wire), the volume fraction of inclusions in the amorphous network must be 100% to reach the threshold value. In the two-dimensional model (which may be viewed as substantially conically shaped inclusions extending through the thickness of the amorphous network), the volume fraction of inclusions in the amorphous network must be about 45% to reach the threshold value. Finally in the three-dimensional model (which may be viewed as substantially spherical shaped inclusions in a sea of amorphous material), the volume fraction of inclusions need only be about 16–19% to reach the threshold value. Therefore, amorphous materials may incorporate crystalline inclusions without being microcrystalline as the term is defined herein.

In many instances it has been found advantageous to fabricate photovoltaic devices comprised of a plurality of individual cells stacked in an optical and electrical series relationship so as to produce tandem photovoltaic devices. In some instances the band gaps of the materials comprising the individual cells of the tandem device are varied so as to produce a spectrum splitting device in which the uppermost cells thereof are responsive to short wavelength illumination and relatively transparent to longer wavelength illumination, while the bottom cells of the stack are tailored to absorb and respond to longer wavelength illumination. The high transparency and good electrical conductivity of microcrystalline materials makes them useful in the fabrication of tandem N-I-P type photovoltaic devices, and tandem devices incorporating microcrystalline P layers are shown in U.S. Pat. No. 4,609,771, the disclosure of which is incorporated herein by reference.

Tandem N-I-P type devices include an internal junction between the N layer of a first cell and the P layer of a succeeding cell. This junction is not a photovoltaicly productive junction, and the inventors hereof have reasoned that device performance could be improved if the electrical conductivity and/or transparency of the N layer could be improved. A decrease in optical absorption of the N layer will permit more light to pass through to the photo generative portion of the cell, thereby improving short circuit current. The increase in conductivity will improve the fill factor of the cell by optimizing the tunnel junction between the N and P layer, and will also improve the open circuit voltage of the cell. Overall, it is expected that inclusion of a microcrystalline N layer into an N-I-P type cell, particularly one incorporated into a tandem device, will improve the overall performance of the device.

In order to verify this hypothesis, the inventors hereof prepared a series of N-I-P type photovoltaic devices, each comprised of a layer of N doped silicon alloy material supported upon a substrate electrode, a body of intrinsic silicon alloy material deposited thereatop, and a layer of microcrystalline P type silicon alloy material disposed upon the intrinsic layer. In order to approximate the effects in a tandem device, the inventors hereof deposited an additional layer of N doped material atop the light incident, P layer of the aforementioned devices. In a first experiment, the additional N layer was a layer of substantially amorphous silicon alloy material. In a second experiment, the second N layer was a microcrystalline layer fabricated under deposition conditions favoring the preparation of a slightly microcrystalline layer; and a third experiment involved the deposition of a highly microcrystalline layer of N doped material atop the P layer of the aforementioned cell. The operational parameters of each of the foregoing devices were then measured and are summarized hereinbelow in Table 1 where $J_{sc}$ is the short circuit current, $Q_{550}$ is the quantum efficiency at 550 nm, $V_{oc}$ is the open circuit voltage, and FF is the fill factor.

TABLE 1

| Sample | $J_{sc}$ | $Q_{550}$ | $V_{oc}$ | FF |
|--------|----------|-----------|----------|-------|
| 1      | 11.2     | 0.70      | 0.916    | 0.592 |
| 2      | 11.5     | 0.72      | 0.948    | 0.643 |
| 3      | 11.9     | 0.74      | 0.938    | 0.610 |

It will be noted from the foregoing that cell performance does in fact increase as the top N layer becomes microcrystalline.

Having conducted this experiment, the inventors hereof then proceeded to fabricate a series of tandem devices from stacked N-I-P type cells. In a first device, indicated by sample no. 4 in Table 2 hereinbelow, the N layer which was in contact with the P layer was fabricated from amorphous, N doped silicon alloy material, corresponding generally to the amorphous material of sample 1 of Table 1. In a second device of this experimental series, indicated by sample no. 5 in Table 2, the corresponding N layer was fabricated from a microcrystalline material having a relatively high degree of microcrystallinity and corresponding generally to that of sample 2 of Table 1. A third device of this experimental series is indicated by sample no. 6 in Table 2 hereinbelow and includes an N layer having a high degree of microcrystallinity and corresponding generally to that of sample 3 of Table 1. The thus fabricated devices were tested and the open circuit voltage and fill factors thereof are summarized in Table 2 hereinbelow.

TABLE 2

| Sample | $V_{oc}$ | FF    |
|--------|----------|-------|
| 4      | 1.804    | 0.652 |
| 5      | 1.755    | 0.659 |
| 6      | 1.657    | 0.666 |

As will be seen from Table 2, the results of this experimental series were surprising insofar as the open circuit voltage of the tandem photovoltaic devices actually dropped as the N layer became more microcrystalline. This result appears counterintuitive, and at odds with the data from the first experimental series as summarized in Table 1. While the inventors hereof do not wish to be bound by speculation, it is postulated that the loss of open circuit voltage is resultant from a mismatch in the band gaps of the microcrystalline N and the amorphous I layer; which, because of the relative positions of the fermi levels therein produces an overall lowered cell voltage as compared to the voltage produced when an amorphous N layer is joined to an amorphous I layer.

In any instance, it is clear from the foregoing that inclusion of a highly conductive, highly transparent, microcrystalline N layer in an N-I-P type photovoltaic device is expected to provide enhanced device output, as compared to when an amorphous layer is included. However, while such benefits have heretofore been demonstrated in single cell devices, tandem devices fabricated with microcrystalline N layers actually show a reduced output, primarily as a result of lowered device voltage. The present invention provides a particular configuration of photovoltaic device which attains the benefits resultant from the high transparency and high conductivity of a microcrystalline body of N doped material while preventing the loss of voltage as demonstrated in the second experimental series detailed hereinabove. These and other advantages of the present invention will be readily apparent from the drawings, discussion and description which follow.

BRIEF DESCRIPTION OF THE INVENTION

There is disclosed herein a photovoltaic device of the type including an N-I-P type photovoltaic cell having a body of substantially intrinsic semiconductor material interposed between a body of N doped semiconductor material and a body of P doped semiconductor material. In accord with the present invention the N doped body of semiconductor material is a multi-layered body comprising a first layer of amorphous, N doped semiconductor material disposed in overlying contact with the intrinsic body of the cell, and a layer of microcrystalline, N doped semiconductor material disposed upon the first layer of amorphous, N doped semiconductor material and separated from the substantially intrinsic body thereby. In particular embodiments, the device of the present invention comprises a tandem photovoltaic device including at least a first and a second N-I-P type photovoltaic cell stacked in optical and electrical series relationship, and in this device, the N doped body of at least one of the cells comprises the multi-layered N doped body of the present invention.

In further embodiments, the multi-layered N doped body is a tri-layered body comprised of a first and a second layer of amorphous, N doped semiconductor material, with the layer of microcrystalline, N doped semiconductor material disposed therebetween. This embodiment is particularly advantageous when the N doped body must contact a microcrystalline, P doped body.

In specific embodiments of the invention, the intrinsic bodies of the photovoltaic cells are fabricated from group IV semiconductor alloy materials such as silicon alloy materials, germanium alloy materials, and combinations thereof. In those instances where the device is a multiple cell, tandem device, the band gaps of the various cells of the device may be the same or they may differ. The present invention may be utilized in combination with cells supported upon an opaque, preferably reflective substrate or upon a transparent substrate.

DETAILED DESCRIPTION OF THE INVENTION

In accord with one aspect of the present invention, it has been found that in an N-I-P type photovoltaic device, the advantages of including a microcrystalline body of semiconductor material therein may be achieved, if a relatively thin layer of amorphous, N doped semiconductor material is interposed between an amorphous, intrinsic layer and the microcrystalline, N doped semiconductor material. While not wishing to be bound by theory, it is speculated that the amorphous, N layer has a band structure which is compatible with the band structure of the amorphous, I layer so as to permit the device to achieve maximum voltage, while the remainder of the N body which is microcrystalline, provides high conductivity and high transparency as will be detailed in the examples which follow hereinbelow.

Figure 1:
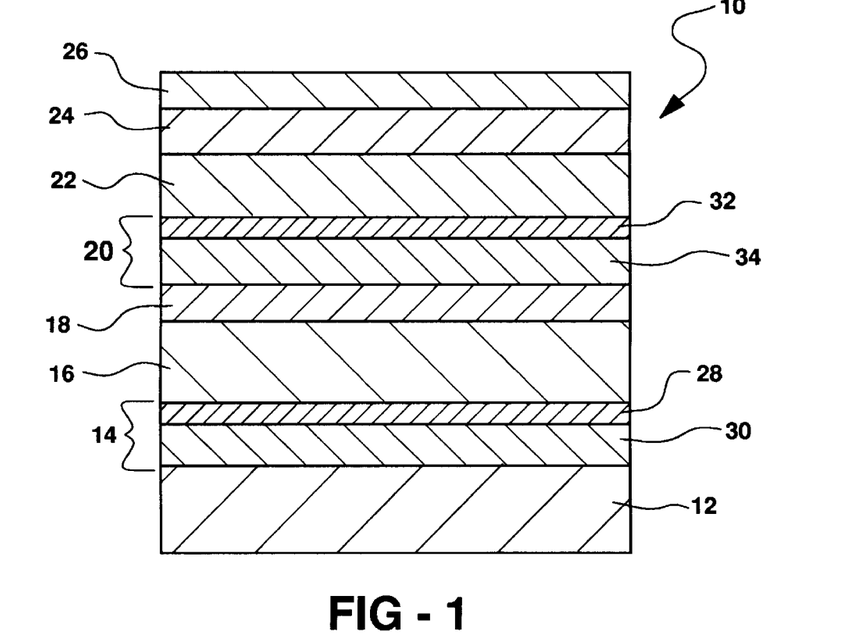
FIG. 1 is a cross-sectional view of one embodiment of tandem photovoltaic device structured in accord with the principles of the present invention.

Referring now to FIG. 1, there is shown a cross-sectional view of one embodiment of tandem photovoltaic device 10 structured in accord with the principles of the present invention. The device 10 of FIG. 1 includes a supporting substrate 12, which in this embodiment is an opaque, metallic substrate which also provides one of the electrodes of the device 10. As is known in the art, the substrate 12 may comprise a solid sheet of metal, or it may comprise a sheet of insulating material such as a sheet of plastic or glass material having an electrically conductive layer thereupon. In addition, the substrate may include a reflective layer, a transparent, electrically conductive texturizing layer and/or other such ancillary layers as is known in the art, and within the context of the present disclosure, all of said structures will be collectively referred to as a substrate. Supported upon the substrate are two photovoltaic cells. The first cell is comprised of a first body of N doped semiconductor material 14 supported on the substrate 12; a second body of substantially intrinsic semiconductor material 16 disposed upon, and in electrical communication with the body of N doped semiconductor material 14, and a body of P doped semiconductor material 18. These three bodies define a N-I-P type photovoltaic cell. A second photovoltaic cell is disposed immediately atop the first, and is comprised of a second N doped body of semiconductor material 20, a second body of substantially intrinsic semiconductor body 22 and a third body of P doped semiconductor material 24. A body of top electrode material 26 is disposed upon the second P layer 24, and this body is preferably a body of transparent, electrically conductive material such as a transparent conductive oxide material. As is known in the art, a current collection grid may also be disposed upon the top electrode.

In the illustrated embodiment, the bodies of intrinsic material 16 and 22 are bodies of amorphous semiconductor material, most preferably comprised of an alloy of a group IV element. In some instances, the two intrinsic bodies 16, 22 may be fabricated from materials having substantially similar band gaps, while in other instances the device 10 may be a spectrum splitting tandem device, in which case the second body of intrinsic material 22 will be fabricated from a relatively wide band gap material such as a hydrogenated silicon alloy material while the first intrinsic body 16 will be fabricated from a narrow band gap material such as a hydrogenated silicon germanium alloy material or a hydrogenated germanium alloy material. As illustrated in FIG. 1, the thickness of the second intrinsic body 22 is somewhat less than the thickness of the first intrinsic body 16. This is because as light penetrates through the device 10 it is absorbed, and the level of illumination striking the first body 16 will be less than that striking the second body 22. By varying the thickness of the two intrinsic bodies 16 and 22, the relative amounts of photo current produced thereby may be balanced so as to optimize the output of the photovoltaic device, as is known in the art.

It is notable that in accord with the present invention, the first 14 and second 20 bodies of N material are dual layered bodies. Specifically, the first body 14 is comprised of a layer of amorphous, N doped semiconductor material 28 disposed so as to be in contact with the first body of intrinsic semiconductor material 16. The first N doped body 14 further includes a second, microcrystalline layer 30 which is in contact with the amorphous layer of N doped semiconductor material 28 and is separated from the first intrinsic body 16 by the amorphous N doped layer 28. The second body of N doped semiconductor material 20 is also of a bi-layered structure and similarly includes an amorphous layer 32 in contact with the second intrinsic body 22, and a microcrystalline layer 34 in contact with the amorphous layer 32 and also spaced from the intrinsic layer 22 by it.

As noted previously, the device 10 of FIG. 1 preferably includes microcrystalline P doped layers 18 and 24. In operation, light strikes the device 10 from the top and enters through the transparent top electrode 26 and passes through the second microcrystalline P layer 24 and into the second body of intrinsic semiconductor material 22, where a portion is absorbed so as to photo generate carrier pairs. The light then passes through the second body of N doped material 20, and since the majority of this body is microcrystalline, the light is minimally absorbed. The light continues on through the first P doped body 18 which is also microcrystalline and on to the first body of intrinsic semiconductor material 16 where the majority of the remaining light is absorbed. Any unabsorbed light passes through the first N doped body 14, and again is relatively unabsorbed because the majority of that body 14 is microcrystalline. The remaining light is then reflected by the substrate 12 so as to pass back through the first N doped body 14 for absorption by the first intrinsic body 16. It will thus be appreciated that the presence of the microcrystalline P body, and the mostly microcrystalline N doped body, limits nonproductive absorption of light by the cells comprising the device. In addition, the high electrical conductivity of the microcrystalline materials minimizes series resistance in the device.

As illustrated, each of the N bodies 14, 20 is a multi-layered body and includes an amorphous portion in contact with the corresponding amorphous body of intrinsic material and a microcrystalline portion spaced from the intrinsic body by the amorphous portion. Preferably, the amorphous portion will be made to be thinner than the microcrystalline portion. It has been found that a relatively thin amorphous portion is sufficient to provide an optimized voltage in the cell, while the remaining microcrystalline portion provides high conductivity, optical transparency and suffices to establish a built in potential which enables collection of the photo generated current.

In the device 10 of FIG. 1, the thickness of the doped semiconductor bodies 14, 18, 20 and 24 is approximately 200 angstroms; while the thickness of the first intrinsic body 16 is approximately 1000 to 2000 angstroms and that of the second intrinsic body 22 is approximately 800 angstroms. As noted above, the amorphous layer constituting the dual layered N doped body, for example amorphous layer 28 of N doped body 14 will be thinner than the corresponding microcrystalline layer, for example layer 30. Typically, the amorphous layer will comprise 20 to 60% of the thickness of the N doped body. Generally, when the thickness of the body is 200 angstroms the amorphous portion will comprise approximately 40 to 120 angstroms thickness.

Figure 2:
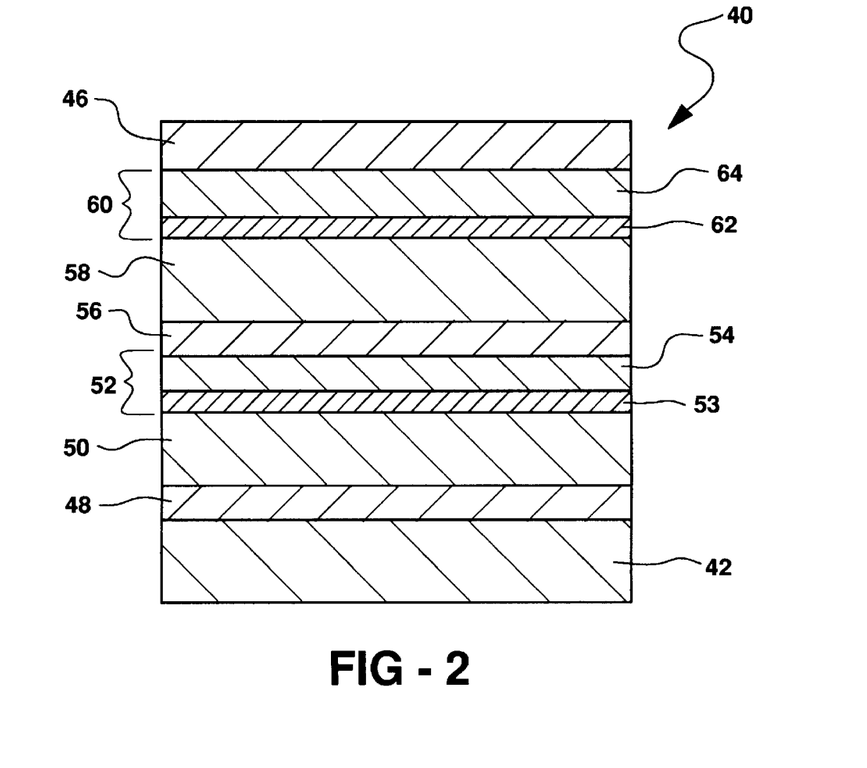
FIG. 2 is a cross-sectional view of another embodiment of tandem photovoltaic device structured in accord with the principles of the present invention.

Referring now to FIG. 2, there is shown another configuration of tandem photovoltaic device 40 structured in accord with the principles of the present invention. Device 40 of FIG. 2 is of an inverted structure compared to device 10 of FIG. 1, and is fabricated upon a transparent, electrically conductive substrate 42, which may comprise a sheet of glass or polymeric material having an electrically conductive, transparent, coating thereupon. Devices of this type are adapted for illumination from the substrate side thereof, and typically include a top electrode 46 which is fabricated from a metallic layer.

The device 40 of FIG. 2 includes a first body of P doped semiconductor material 48, which is preferably a microcrystalline P doped material, supported upon the substrate 42. A first body of intrinsic semiconductor material 50 is disposed upon the first P doped body 48, and a first body of N doped semiconductor material 52 is disposed upon the first intrinsic body 50; and these bodies comprise a P-I-N type photovoltaic cell. As noted in connection with the previous embodiment, the N doped body 52 is a dual layered body comprised of an amorphous layer 53 in contact with the first intrinsic body 50, and a microcrystalline layer 54 in contact with the amorphous layer 52 and separated from the first intrinsic body 50 thereby.

A second cell of the device 40 is comprised of a second P doped body 56, also preferably a microcrystalline body; a second intrinsic body 58 and a second N doped body 60. As previously discussed, this second N doped body 60 is also a dual layered body comprised of an amorphous layer 62 and a microcrystalline layer 64. As previously noted, a top electrode 46 is in electrical communication with the second N doped body 60. The device 40 of FIG. 2 is generally similar in operation to device 10 illustrated in FIG. 1. Likewise, materials and layer thicknesses may be generally similar.

As noted above, in tandem photovoltaic devices comprised of two or more stacked N-I-P type photovoltaic cells, there exists a photovoltaicly non-productive junction between the P layer of one cell and the N layer of an overlying cell. This junction is often referred to as a "tunnel" junction. There are particular advantages to employing microcrystalline semiconductor material in the N and P layers of the cells, and it is well known in the prior art to include microcrystalline P material in such devices. In accord with a further aspect of the present invention, it has been found that the overall efficiency of tandem photovoltaic devices having microcrystalline P and N layers therein will be improved if a relatively thin layer of amorphous photovoltaic material is interposed at the interface between the microcrystalline P and N semiconductors. This layer will most preferably be an amorphous N layer, and will comprise a portion of the multi-layered N doped body described hereinabove.

Figure 3:
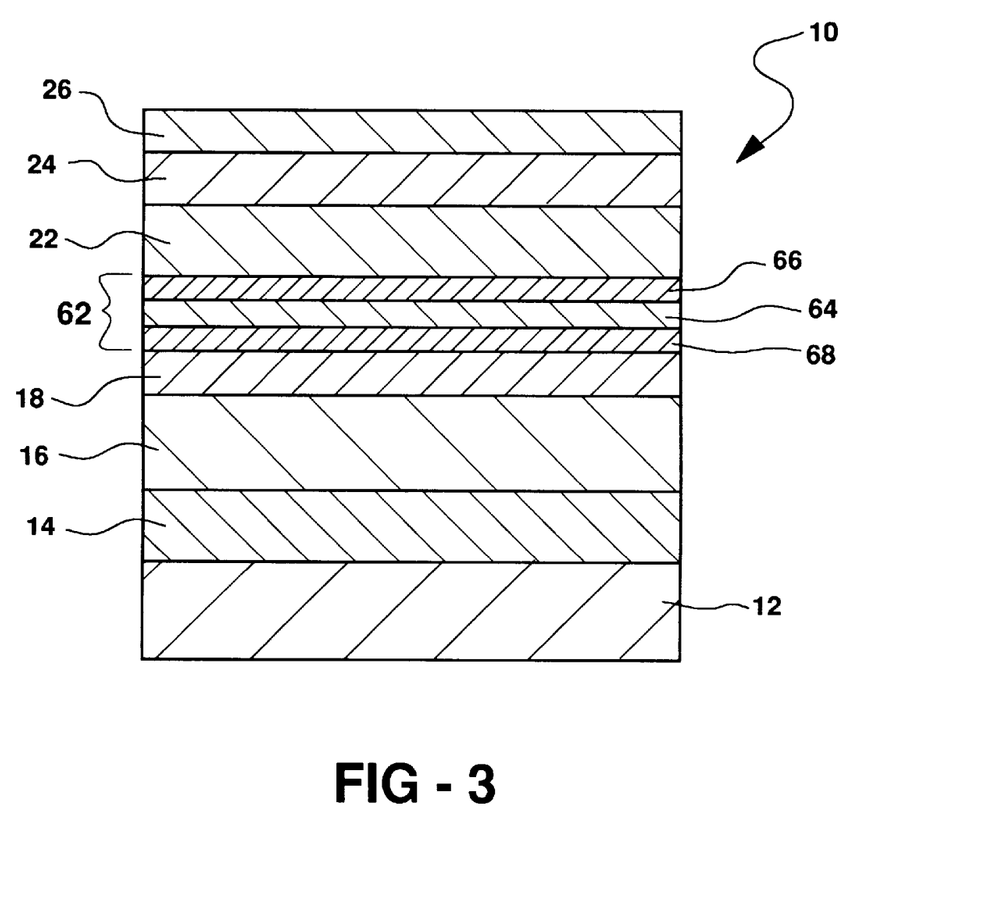
FIG. 3 is a cross-sectional view of yet another embodiment of tandem photovoltaic device structured in accord with the principles of the present invention.

Referring now to FIG. 3, there is shown a cross-sectional view of a photovoltaic device 60 structured in accord with this aspect of the invention. Device 60 of FIG. 3 is configured as a tandem photovoltaic device having two N-I-P type cells stacked in an optical and electrical series relationship, as in the foregoing drawings. The device 60 is fabricated on a substrate 12, which is generally similar to that previously described. Supported upon the substrate 12 are two photovoltaic cells. The first cell is comprised of a first body of N doped semiconductor material 14 supported upon the substrate 12; a second body of substantially intrinsic semiconductor material 16 disposed upon, and in electrical communication with a body of N doped semiconductor material 14 and a body of P doped semiconductor material 18, which is preferably a body of microcrystalline, P doped semiconductor material.

The second photovoltaic cell is comprised of a multi-layered body of N doped semiconductor material 62, and further includes a body of intrinsic semiconductor material 22 disposed upon the N doped body 62, and a body of microcrystalline, P doped semiconductor material 24, atop the intrinsic body 22. As in the foregoing examples, a top electrode body 26, preferably fabricated from a transparent, electrically conductive material, such as a transparent conductive oxide, is disposed atop the topmost P layer. As was explained hereinabove, and as is known in the art, current collecting grid structures, bus bars and the like may also be included in the photovoltaic device 60 of FIG. 3.

In accord with this aspect of the invention, the N doped body 62 is a tri-layered body; and it includes a layer of microcrystalline, N doped semiconductor material 64 as previously described, as well as a first layer of amorphous, N doped semiconductor material 66 interposed between the layer of microcrystalline material 64 and the body of substantially intrinsic semiconductor material 22. The N doped body 62 further includes a second layer of amorphous, N doped semiconductor material 68 which is interposed between the layer of microcrystalline N doped material 64 and the body of microcrystalline P doped semiconductor material 18. As will be explained in greater detail hereinbelow with reference to experimental data, inclusion of this second amorphous layer further enhances the performance of the tandem photovoltaic device. While not wishing to be bound by speculation, it is believed that the dilute, energetic deposition conditions employed for the preparation of the N doped microcrystalline semiconductor material degrade the tunnel junction interface between the microcrystalline P layer and the N body, in those instances where microcrystalline N material is being deposited directly atop microcrystalline P material. Consequently, the inclusion of a relatively thin buffer layer of amorphous semiconductor material, which is most preferably amorphous N doped material, at this interface still further enhances the output of the device.

While this amorphous buffer layer can be an amorphous P layer or an amorphous N layer, it is most generally preferred that it be an amorphous N layer. Amorphous P material typically has very high optical absorption, and poor electrical conductivity as compared to amorphous N material; hence, its inclusion at this interface will have a greater negative impact on the photovoltaic device, in terms of nonproductive optical absorption, and series resistance, as compared to a corresponding device made with an amorphous N layer.

In the most preferred configuration of the present invention, an amorphous N layer will be interposed between the intrinsic body and the microcrystalline N material; therefore, the deposition of the tri-layered structure comprising a layer of microcrystalline N doped material interposed between a top and a bottom amorphous layer of N doped material will be readily implemented. Also, while this aspect of the present invention is described primarily in the context of stacked, tandem photovoltaic devices, it is to be understood that similar benefits may be achieved therefrom in other semiconductor devices wherein an interface is established between a microcrystalline body of P doped semiconductor material and a microcrystalline body of N doped semiconductor material.

In accord with the present invention, still further N-I-P type cells may be incorporated into a tandem device, and such cells may also include the multi-layered N body of the present invention. It should also be noted that while FIGS. 1 and 2 show dual tandem devices in which both of the N bodies are dual multi-layered N bodies, in some instances, it may only be necessary to include one multi-layered N body in a tandem device; for example as shown in FIG. 3, the N body is at the bottommost portion of a device, and it is not anticipated that significant reflection from the back electrode will take place; therefore, high transparency may not be required, and the bottommost N layer may be entirely amorphous.

It should also be noted that while the present invention has been explained primarily with reference to tandem devices comprised of stacked N-I-P type cells, the present invention may also be advantageously practiced in connection with devices comprised of single N-I-P type cells, since in general, the high electrical conductivity and the optical transparency of the microcrystalline N layer will benefit single cells as well as tandem devices.

In general, the present invention may be advantageously implemented into any semiconductor device in which a body of N doped semiconductor material is in contact with a body of amorphous, substantially intrinsic semiconductor material, and/or a layer of microcrystalline P doped material, and where the benefits and advantages of employing a microcrystalline layer of N doped material are to be achieved, since the present invention allows for the successful inclusion of such a microcrystalline layer, by recognition of the fact that an amorphous, N doped transition layer should be included therebetween.

The operation and advantages of the present invention will best be illustrated by the following experimental series which describes the results attained in the fabrication of a series of tandem N-I-P type photovoltaic devices through the use of the present invention.

EXPERIMENTAL

In this first experimental series a group of three N-I-P/N-I-P tandem photovoltaic cells were prepared. In order to assure constancy, all three devices had identical bottom cells cut from a single large area cell which was fabricated upon a stainless steel substrate by a radio frequency energized glow discharge deposition process.

In order to prepare this bottom cell, a rectangular substrate of approximately 14×15 inches was placed in a deposition chamber which was sealed from the ambient atmosphere, and an atmosphere comprising 1000 SCCM of hydrogen, 50 SCCM of silane and 100 SCCM of a 1% mixture of phosphine and hydrogen was flowed therethrough. A pump associated with the deposition apparatus was adjusted to maintain a pressure of 0.7 torr in the chamber. The substrate was heated to a temperature of 250° C. and the gas mixture energized with a radio frequency energy of 13.56 MHz from a rectangular cathode of approximately 16×18 inches, at a power of approximately 50 watts. Deposition conditions were maintained for approximately 3 minutes until approximately 200 angstroms of N doped amorphous silicon alloy material was deposited onto the substrate, at which time cathode power was terminated.

An approximately 2000 angstrom thick layer of intrinsic, amorphous silicon material was deposited atop the N doped layer, and toward that end a deposition atmosphere of 1000 SCCM of hydrogen and 10 SCCM of disilane was flowed through the chamber at a pressure of 0.6 torr. The substrate was again maintained at a temperature of 250° C. and the cathode energized with 42 watts so as to deposit a 2000 angstrom thick layer of intrinsic material.

In the next step, a microcrystalline, P doped layer was deposited atop the intrinsic layer by the use of an atmosphere of 5500 SCCM of hydrogen, 110 SCCM of a 4% mixture of $BF_3$ in hydrogen and 11 SCCM of silane which was flowed through the chamber at a pressure of 2.3 torr. The cathode was energized with 900 watts and the deposition conditions maintained for approximately 75 seconds, so as to deposit approximately 100 angstroms of microcrystalline P material and complete deposition of the first cell.

A first test device, designated "sample 7", was prepared by depositing a second cell atop a portion of the aforedescribed bottom cell. In the sample 7 device, the N doped body of the upper cell is an amorphous body in accord with the prior art.

The second N-layer was deposited from an atmosphere of 30 SCCM of hydrogen; 0.65 SCCM of disilane and 0.75 SCCM of a 1% mixture of $PH_3$ in hydrogen. The atmosphere was maintained at a pressure of 1.2 torr, and was decomposed by radio frequency energy of 13.56 MHz supplied at a power level of 2.3 watts from a cathode having a diameter of approximately 3.5 inches. During this deposition, the substrate was maintained at a temperature of 225° C., and deposition time was about 40 seconds. The second intrinsic layer of the device was deposited from an atmosphere of 30 SCCM of hydrogen, and 0.65 SCCM of disilane maintained at a pressure of 1.2 torr. The atmosphere was energized with 1.7 watts of radio frequency energy at 13.56 MHz from a 3.5 inch cathode, and the substrate was maintained at 275° C. Total deposition time for this layer was about 9 minutes.

The sample 7 device was completed by depositing a microcrystalline P layer atop the I layer. The P layer was deposited from an atmosphere of 95 SCCM of hydrogen, 2.5 SCCM of a 5% mixture of $SiH_4$ in hydrogen and 1.2 SCCM of a 4% mixture of $BF_3$ in hydrogen. Gas pressure was maintained at 1.7 torr, substrate temperature at 175° C., and the power applied to a 3.5 inch diameter cathode was 55 watts at 13.56 MHz. Deposition conditions were maintained for 50 seconds.

After completion of the second cell, the thus fabricated sample 7 device was provided with a transparent, conductive top electrode in a conventional vacuum evaporation process. This device was tested by illumination under an approximately AM-1.5 solar spectrum and its open circuit voltage and fill factor measured. The results are summarized as sample 7 in Table 3 hereinbelow.

A second tandem photovoltaic device, designated sample 8, was prepared in accord with the present invention. This device included a first cell cut from the large area device and substantially identical to the first cell of the sample 7 device. The second cell of sample 8 was essentially identical to that of sample 7, except that it included the dual layered N body of the present invention, and for its fabrication a microcrystalline layer of N doped material was deposited atop the P layer of the first cell by employing an atmosphere comprising 50 SCCM of hydrogen, 10 SCCM of a 5% mixture of silane in hydrogen and 2.4 SCCM of a 1% mixture of phosphine in hydrogen. The substrate temperature was again maintained at 225° C. and a pressure of 1.7 torr maintained in the deposition apparatus. Power of 55 watts was applied to the 3.5 inch cathode, and deposition carried out for approximately 40 seconds so as to deposit a layer of microcrystalline N doped material. The radio frequency power was then terminated, and the previously described conditions employed for deposition of amorphous N doped material in the top cell of sample 7 were reimplemented for approximately 10 seconds so as to deposit a thin layer of amorphous N doped material atop the microcrystalline N doped material. This device was also tested, and its open circuit voltage and fill factor are summarized in Table 3 hereinbelow as sample 8.

Another tandem device designated sample 9 was prepared in accord with the present invention. This device also included a first N-I-P cell cut from the large area device as in the foregoing examples. A dual layered N body was then prepared by first depositing a layer of microcrystalline N doped semiconductor material atop the first body of P doped material by radio frequency energized glow discharge deposition process which employed a deposition atmosphere of 180 SCCM of hydrogen, 10 SCCM of a 5% mixture of silane in hydrogen, and 2.4 SCCM of a 1% mixture of phosphine in hydrogen. Again, the substrate temperature was maintained at 225° C., the pressure at 1.7 torr, and power of 55 watts applied to the cathode. This deposition was carried out for approximately 60 seconds so as to produce a microcrystalline layer of N doped silicon alloy material, after which the radio frequency power was terminated, and the previously described deposition conditions employed for preparation of the amorphous N doped material were re-implemented for approximately 15 seconds. This device was completed as the previous examples by subsequent deposition of an intrinsic layer, a microcrystalline P layer and a layer of transparent electrode material. This device was also tested, and its open circuit voltage and fill factor are as noted in Table 3 with regard to sample 9.

TABLE 3

| Sample | $V_{oc}$ | FF |
|---|---|---|
| 7 | 1.797 | 0.636 |
| 8 | 1.819 | 0.645 |
| 9 | 1.810 | 0.690 |

It will be seen from the foregoing data, that inclusion of the dual layered N body of the present invention provides a tandem photovoltaic device having an open circuit voltage and a fill factor which are significantly improved as compared to the same device including an entirely amorphous body of N doped material. The three experiments summarized as samples 7, 8 and 9 represent matched, consecutive deposition runs and provide for a very direct comparison of data illustrating the advantages of the present invention. It should be noted that sample 7 corresponds structurally to sample 4 as summarized on Table 2. Owing to some variation in deposition conditions the open circuit voltage and fill factor of the two vary somewhat from one other. Likewise, samples 8 and 9 correspond generally to samples 5 and 6 of Table 2, except that they include the amorphous N layer between the microcrystalline N and intrinsic materials, and it will be noted that while samples 5 and 6 represent significant losses in performance as compared to sample 4, samples 8 and 9 represent a significant improvement over the performance of sample 7. Accordingly, it will be seen that the present invention provides a tandem photovoltaic device which incorporates an N doped body of semiconductor material having an amorphous layer and a microcrystalline layer, and that a device thus constructed achieves results superior to that attained by a corresponding device which includes an entirely amorphous layer or an entirely microcrystalline layer.

Another experimental series was carried out to evaluate the effect of interposing an amorphous buffer layer between the microcrystalline P and microcrystalline N layers of a tandem photovoltaic device. In this experimental series, all devices were fabricated upon selected, stainless steel substrates, and were prepared under matched conditions so as to enable direct comparison of data. A first device, represented as sample 10 at Table 4 hereinbelow, was prepared comprising a same gap, dual tandem photovoltaic device, generally similar to that of sample 7 in the foregoing experiment. The device included a bottom, N doped layer of amorphous semiconductor material of approximately 200 angstroms thickness, and a layer of intrinsic, amorphous silicon alloy material of approximately 2000–3000 angstroms thereatop. A layer of P doped microcrystalline silicon, was deposited upon the bottom most intrinsic layer as in the previous experiments.

The second cell of sample 10 was deposited atop the first, and comprised a layer of N doped, amorphous silicon material of approximately 200 angstroms thickness, with a layer of intrinsic amorphous silicon of approximately 800 angstroms thickness thereatop, and a microcrystalline layer of P doped semiconductor material thereupon. As in the foregoing examples, the device included a top electrode layer of a transparent, conductive oxide material. This device represents prior art tandem photovoltaic devices.

For purposes of comparison, a second photovoltaic device, comprising sample 11, was prepared. This device was generally similar to that of sample 10, except that the N doped layer of the topmost cell comprised a tri-layered body including a layer of microcrystalline, N doped semiconductor material interposed between two amorphous layers of N doped semiconductor material, so that both the intrinsic material and microcrystalline P doped material are separated from the microcrystalline N material by a layer of amorphous N doped material. In this embodiment, the tri-layered body was prepared by first depositing a relatively thin layer of amorphous N doped alloy material as in the foregoing example from an atmosphere of approximately 48.5 SCCM of hydrogen, 0.8 SCCM of disilane and 0.7 SCCM of a 1% mixture of phosphine and hydrogen, maintained at a pressure of 1.35 torr. Substrate temperature during this deposition was approximately 175° C., and the gas mixture was energized with radio frequency energy of 13.56 MHz from a cathode of approximately 3.5 inches in diameter at a power of approximately 2.5 watts.

Deposition conditions were maintained until approximately 50 angstroms of N doped amorphous silicon alloy material was deposited onto the microcrystalline P layer, at which time deposition conditions were changed so as to result in the deposition of a microcrystalline layer of N doped material. Toward that end, the atmosphere in the deposition chamber was changed to 100 SCCM of hydrogen, 0.25 SCCM of disilane and 7.5 SCCM of a 1% mixture of phosphene in hydrogen. Substrate temperature was again maintained at 175° C. and a pressure of 1.8 torr maintained in the apparatus. Power of 30 watts was applied to the cathode, and the deposition carried out for approximately 210 seconds so as to deposit a layer of microcrystalline N doped material. After completion of the deposition of the microcrystalline layer, deposition conditions previously employed for the preparation of the amorphous N material were reimplemented, and approximately 50 angstroms of amorphous N doped alloy material deposited. As in the foregoing example, subsequent top intrinsic, top microcrystalline P and top electrode layers were deposited.

The devices of sample 10 and sample 11 represent matched devices, and both were evaluated by illumination under an approximately AM-1.5 solar spectrum. Quantum efficiency of the devices, at 550 nm was measured for both the top and bottom cells individually, and on a combined basis. Also, series resistance of each of the devices was measured.

Data from this evaluation was summarized in Table 4, and comparing sample 10 and sample 11 it will be noted that short circuit current density ($J_{sc}$), in terms of milliamps per centimeter squared, is greater for device 11 which includes the present invention. Similarly, open circuit voltage ($V_{oc}$), fill factor (FF), efficiency ($\eta$) and quantum efficiency (Q) in terms of mA/cm$^2$ is greater for the devices of the present invention than for the prior art device. Similarly, series resistance as measured in ohms cm$^2$ is lower for the device of the present invention.

The foregoing experimental series was duplicated for tandem photovoltaic devices having different band gaps in the two cells thereof. Sample 12 corresponds generally to sample 10, except that the intrinsic layer of the bottommost cell is fabricated from a glow discharge deposited silicon germanium alloy material. Sample 13 corresponds in structure to sample 11, insofar as it includes the tri-layered body of N doped semiconductor material of the present invention; however, the device has a low band gap, silicon germanium alloy material as the intrinsic layer of the bottommost cell. Again, samples 12 and 13 comprise matched experiments representing the present invention and the prior art. As was done for samples 10 and 11, samples 12 and 13 were evaluated under AM 1.5 solar illumination and the various parameters thereof noted. It will be seen that the performance of the device including the present invention exceeds that of the prior art. It will be noted that the fill factor of sample 13 is slightly less than that of sample 12; however, the magnitude of the discrepancy is quite small and not statistically significant.

TABLE 4

| Sample | $J_{sc}$ | $V_{oc}$ | FF | $\eta$ % | $Q_t$ | $Q_b$ | Q | $R_s$ |
|---|---|---|---|---|---|---|---|---|
| 10 | 7.80 | 1.901 | 0.752 | 11.15 | 7.97 | 7.8 | 15.77 | 15.0 |
| 11 | 8.06 | 1.919 | 0.766 | 11.85 | 8.06 | 8.28 | 16.34 | 14.3 |
| 12 | 8.29 | 1.694 | 0.772 | 10.84 | 8.29 | 14.33 | 22.72 | 14.1 |
| 13 | 8.52 | 1.710 | 0.770 | 11.22 | 8.52 | 14.56 | 23.08 | 13.1 |

From the foregoing experimental series, it will be seen that inclusion of a relatively thin, amorphous, N doped semiconductor layer between a body of P doped, microcrystalline semiconductor material and a body of N doped, microcrystalline semiconductor material, enhances the performance of tandem photovoltaic devices. As was explained with regard to the other embodiments, in those instances where a tandem device comprising three or more stacked cells is fabricated, the tri-layered N body of the present invention may be advantageously employed at any of the internal tunnel junctions thereof.

While the foregoing invention was primarily described with reference to tandem photovoltaic devices and N-I-P type photovoltaic devices it should be understood that numerous modifications and variations thereof will be readily apparent to one of skill in the art in view of the teaching presented herein. Therefore, it is to be understood that the invention may be implemented in connection with photovoltaic devices of yet other configurations as well as with any type of semiconductor device in which a body of substantially intrinsic semiconductor alloy material is to be contacted by a body of N doped semiconductor material, or in which a body of microcrystalline, N doped, microcrystalline semiconductor alloy material is in contact with a body of P doped microcrystalline semiconductor alloy material.

In consideration thereof it is to be understood that the foregoing drawings, discussion and description are illustrative of particular embodiments of the invention, and are not meant to be limitations upon the practice thereof. It is the following claims, including all equivalents, which define the scope of the invention. Also, in the disclosure and claims presented herein, the various layers comprising the devices of the present invention are disclosed as being "upon" or "in overlying contact with" one another. This description is a convention to establish the relative positional relationship of the layers and does not imply an absolute sequence for the preparation of the layers or a strict vertical positioning. For example, a first layer described as being upon a second layer, may actually be beneath the second layer when the device is viewed from the light incident side of the device. Similarly, the device may be fabricated by a deposition process wherein the second layer is deposited upon the first. In all of such instances, the first layer is considered to be "upon" the second layer, and vice-versa. A similar relationship is also manifested by layers described as being "in overlying contact."

We claim:

1. A tandem photovoltaic device of the type comprising:
    a first and a second N-I-P type photovoltaic cell stacked in an optical and electrical series relationship, each cell including a body of substantially intrinsic semiconductor material interposed between a body of N doped semiconductor material and a body of P doped semiconductor material;
    wherein at least one of said first and second cells includes a multi-layered N doped body comprising a first layer of amorphous, N doped semiconductor material disposed in overlying contact with the intrinsic body of said cell, and a layer of microcrystalline, N doped semiconductor material disposed upon said first layer of amorphous, N doped semiconductor material, and separated from said substantially intrinsic body thereby.

2. A tandem photovoltaic device as in claim 1, wherein said multi-layered N doped body is a tri-layered body, further including a second layer of amorphous, N doped semiconductor material disposed in overlying contact with said layer of microcrystalline, N doped semiconductor material, and separated from said first layer of amorphous, N doped semiconductor material thereby.

3. A tandem photovoltaic device as in claim 1, wherein the substantially intrinsic semiconductor material of said first and second photovoltaic cells is an amorphous semiconductor material.

4. A tandem photovoltaic device as in claim 1, wherein the intrinsic body of said first and second photovoltaic cells is comprised of a hydrogenated alloy of a group IV element.

5. A tandem photovoltaic device as in claim 1, wherein the intrinsic body of said first and second photovoltaic cell is comprised of a hydrogenated alloy of a material selected from the group consisting of: silicon, germanium, and combinations thereof.

6. A tandem photovoltaic device as in claim 1, wherein the body of P doped semiconductor material and the body of N doped semiconductor material of each of said cells is comprised of a silicon alloy material.

7. A tandem photovoltaic device as in claim 1, further including a third N-I-P type photovoltaic cell stacked in an optical and electrical series relationship with said first and said second N-I-P type photovoltaic cells.

8. A tandem photovoltaic device as in claim 1, wherein the body of substantially intrinsic semiconductor material of the first cell has a band gap which is different from a band gap of the body of substantially intrinsic semiconductor material of the second cell.

9. A tandem photovoltaic device as in claim 1, further including an electrically conductive substrate which supports said first and second cells thereupon and which provides one electrode of said tandem photovoltaic device; and,
a body of top electrode material disposed in electrical communication with said first and second photovoltaic cells, and spaced apart from said substrate thereby.

10. A tandem photovoltaic device as in claim 9, wherein said substrate includes a metallic layer, said metallic layer providing the substrate electrode of said device.

11. A tandem photovoltaic device as in claim 9, wherein said substrate comprises a light transparent substrate having a body of transparent, electrically conductive material supported thereupon, said transparent, electrically conductive material providing the substrate electrode of said device.

12. An N-I-P type photovoltaic cell of the type comprising a body of substantially intrinsic semiconductor material interposed between a body of N doped semiconductor material and a body of P doped semiconductor material wherein the body of N doped semiconductor material is a multi-layered N doped body having a first layer of amorphous, N doped semiconductor material disposed in overlying contact with the body of substantially intrinsic semiconductor material, and a layer of microcrystalline, N doped semiconductor material disposed upon said first layer of amorphous N doped semiconductor material, and separated from said substantially intrinsic body thereby.

13. An N-I-P type photovoltaic cell as in claim 12, wherein said multi-layered N doped body is a tri-layered body further including a second layer of amorphous, N doped semiconductor material disposed in overlying contact with said layer of microcrystalline, N doped semiconductor material and separated from said first layer of amorphous, N doped semiconductor material thereby.

* * * * *